United States Patent
Lin et al.

(10) Patent No.: US 9,742,352 B2
(45) Date of Patent: Aug. 22, 2017

(54) VOLTAGE-CONTROLLED OSCILLATOR

(71) Applicant: National Chi Nan University, Puli, Nantou (TW)

(72) Inventors: Yo-Sheng Lin, Nantou (TW); Wei-Cheng Wen, Nantou (TW)

(73) Assignee: NATIONAL CHI NAN UNIVERSITY, Puli, Nantou (TW)

(*) Notice: Subject to any disclaimer, the term of this patent is extended or adjusted under 35 U.S.C. 154(b) by 0 days.

(21) Appl. No.: 15/340,558

(22) Filed: Nov. 1, 2016

(65) Prior Publication Data
US 2017/0047890 A1 Feb. 16, 2017

Related U.S. Application Data

(63) Continuation-in-part of application No. 14/964,081, filed on Dec. 9, 2015, now abandoned.

(30) Foreign Application Priority Data

Dec. 24, 2014 (TW) .............................. 103145257 A

(51) Int. Cl.
H03B 5/12 (2006.01)

(52) U.S. Cl.
CPC ......... H03B 5/1228 (2013.01); H03B 5/1212 (2013.01); H03B 5/1243 (2013.01); H03B 5/124 (2013.01); H03B 5/1293 (2013.01); H03B 2200/0034 (2013.01)

(58) Field of Classification Search
CPC .... H03B 5/1228; H03B 5/1293; H03B 5/124; H03B 5/1212; H03B 5/1243; H03B 2200/0034

USPC ................................ 331/117 R, 117 FE, 167
See application file for complete search history.

(56) References Cited

U.S. PATENT DOCUMENTS

| | | | |
|---|---|---|---|
| 8,299,862 B1 | 10/2012 | De Bernardinis et al. | |
| 8,446,228 B2 | 5/2013 | Trotta | |
| 2008/0164955 A1 | 7/2008 | Pfeiffer et al. | |
| 2009/0189706 A1 | 7/2009 | Lee et al. | |
| 2012/0062287 A1 | 3/2012 | Jang et al. | |
| 2014/0159825 A1 | 6/2014 | Samala et al. | |
| 2016/0190985 A1* | 6/2016 | Lin .................... | H03B 5/1228 331/117 FE |

OTHER PUBLICATIONS

Cao et al.: "A 50-GHz Phase-Locked Loop in 0.13-microm CMOS", IEEE Journal of Solid-State Circuits, Aug. 2007, vol. 42, No. 8, pp. 1649-1656.

* cited by examiner

Primary Examiner — Richard Tan
(74) Attorney, Agent, or Firm — Merchant & Gould P.C.

(57) ABSTRACT

A voltage-controlled oscillator includes two first inductors having a common node, two varactors respectively coupled to the first inductors, a cross-connected pair coupled to the first inductors, and a reversely tunable source degeneration module coupled to the cross-connected pair. The reversely tunable source degeneration module cooperates with the cross-connected pair to form a negative equivalent capacitance seen into the cross-connected pair from the common node of cross-connected pair and each first inductor. An oscillatory signal pair is provided at the first terminals of the first and second transistors.

13 Claims, 7 Drawing Sheets

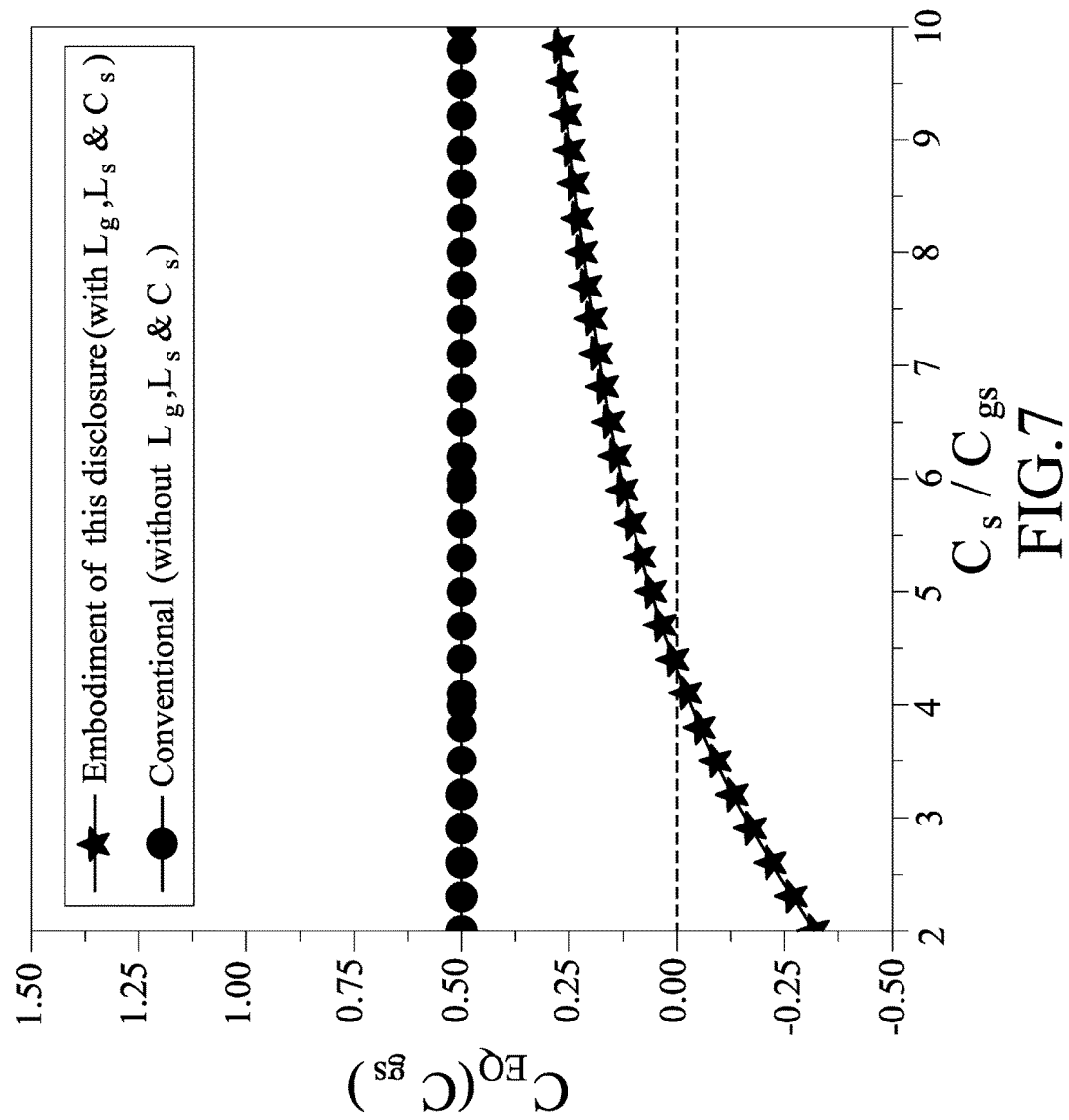

VOLTAGE-CONTROLLED OSCILLATOR

CROSS-REFERENCE TO RELATED APPLICATION

This application is a continuation-in-part of U.S. patent application Ser. No. 14/964,081, filed by the applicant on Dec. 9, 2015, which claims priority of Taiwanese Patent Application No. 103145257 filed on Dec. 24, 2014, and the entire disclosure of which is incorporated herein by reference.

FIELD

The disclosure relates to a voltage-controlled oscillator, and more particularly to a voltage-controlled oscillator adapted for a radio frequency (RF) circuit.

BACKGROUND

Voltage-controlled oscillators (VCO) are critical components in wireless communication systems. As an example, signals of different channels may be selected by changing the output frequency of the VCO. Recently, due to the increasing demand for data transmission, it is important to effectively improve on the operating frequency and the adjustable frequency range.

Referring to FIG. 1, a conventional VCO includes two inductors ($L_g$), two varactors ($C_d$), a cross-coupled pair of transistors ($M_1$, $M_2$), and a current source 11.

A common node of the inductors ($L_g$) is coupled to a voltage source ($V_{DD}$), the varactors ($C_d$) are respectively coupled to the inductors ($L_g$) and have a common node coupled to a bias voltage source ($V_{tune}$) the drain terminal and the gate terminal of each of the transistors ($M_1$, $M_2$) are respectively coupled to the varactors ($C_d$), and the current source 11 is coupled between a common source node of the transistors ($M_1$, $M_2$) and ground.

In application, the voltage provided by the bias voltage source ($V_{tune}$) may be adjusted to change capacitances of the varactors ($C_d$), thereby adjusting an output frequency of the VCO.

However, the operating frequency and the adjustable frequency range of the conventional VCO may be limited due to effective parasitic capacitance of the transistors ($M_1$, $M_2$). In addition, the voltage provided by the voltage source ($V_{DD}$) has to be raised for enabling the transistors ($M_1$, $M_2$) to operate in the saturation region while maintaining sufficient output voltage swing, resulting in higher power consumption.

SUMMARY

Therefore, an object of the disclosure is to provide a voltage-controlled oscillator that may have a relatively higher operating frequency and a relatively wider range of frequency adjustment.

According to the disclosure, the voltage-controlled oscillator includes two first inductors, two first varactors, a cross-connected pair that includes a first transistor, a second transistor, and two second inductors, and a reversely tunable source degeneration module. The two first inductors have a common node. Each of the first inductors has a first terminal coupled to the common node, and a second terminal. Each of the two varactors has a first terminal disposed to receive a first bias voltage, a second terminal coupled to the second terminal of a respective one of the first inductors, and a capacitance associated with a magnitude of the first bias voltage. Each of the first transistor and the second transistor has a first terminal coupled to the second terminal of a respective one of the first varactors, a second terminal and a control terminal. One of the second inductors is coupled between the control terminal of the first transistor and the first terminal of the second transistor, and the other one of the second inductors is coupled between the control terminal of the second transistor and the first terminal of the first transistor. The reversely tunable source degeneration module is coupled to the second terminals of the first and second transistors, is configured for source degeneration of the first and second transistors, and cooperates with the first and second transistors and the second inductors to form a negative equivalent capacitance seen into the cross-connected pair from the first terminal of each of the first and second transistors. A first oscillatory signal is provided at the first terminal of the first transistor, and a second oscillatory signal is provided at the first terminal of the second transistor.

BRIEF DESCRIPTION OF THE DRAWINGS

Other features and advantages of the disclosure will become apparent in the following detailed description of the embodiments with reference to the accompanying drawings, of which:

FIG. 7 is a plot showing comparison between equivalent capacitances of the embodiment and a conventional VCO.

DETAILED DESCRIPTION

Figure 1:
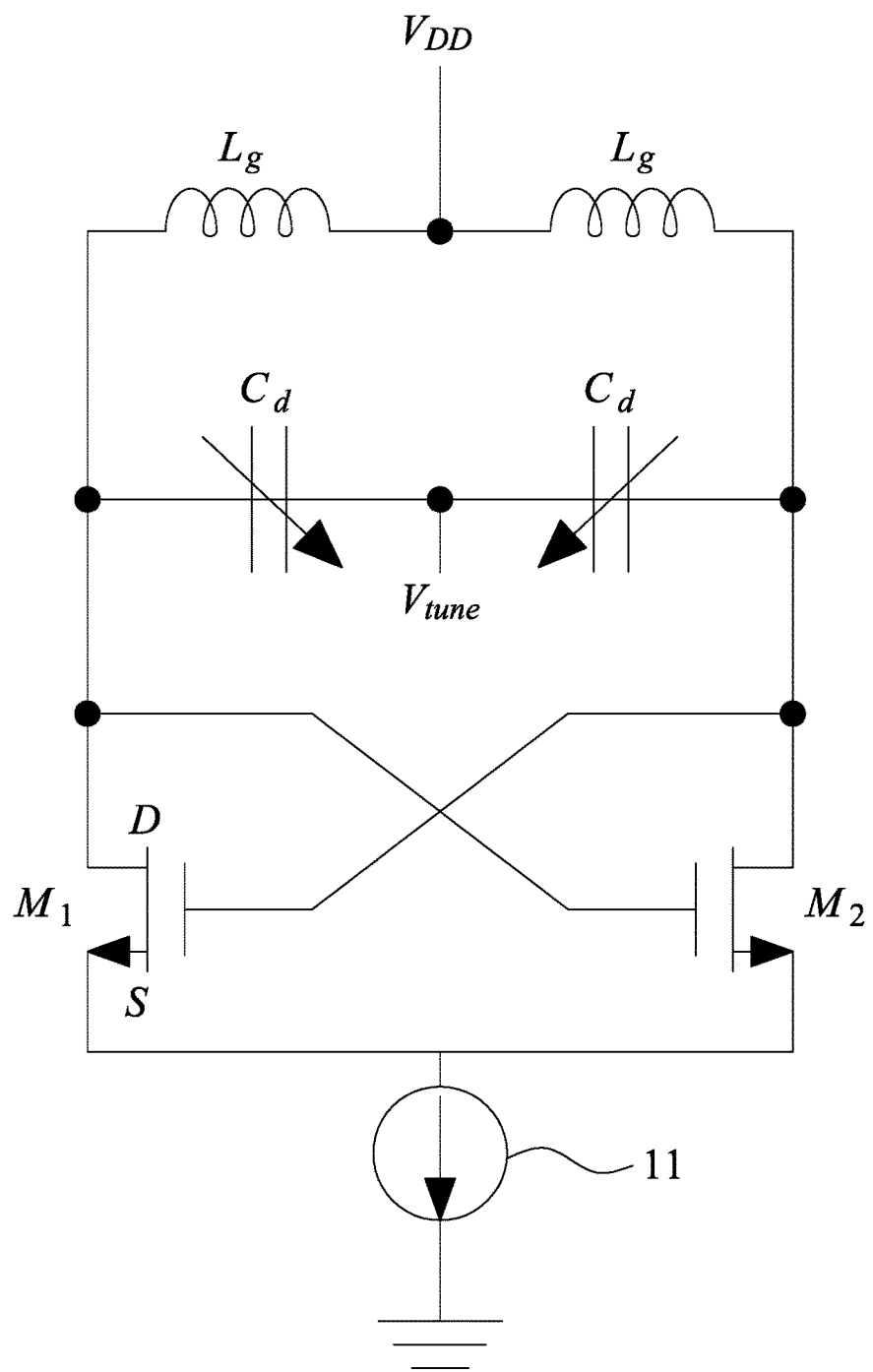
FIG. 1 is a schematic circuit diagram illustrating a conventional voltage-controlled oscillator.

Before the disclosure is described in greater detail, it should be noted that like elements are denoted by the same reference numerals throughout the disclosure, and that the reference numerals used for the elements may also be used to represent property values of the elements, such as a resistance of a resistor, a capacitance of a capacitor/varactor, an inductance of an inductor, etc.

Figure 2:
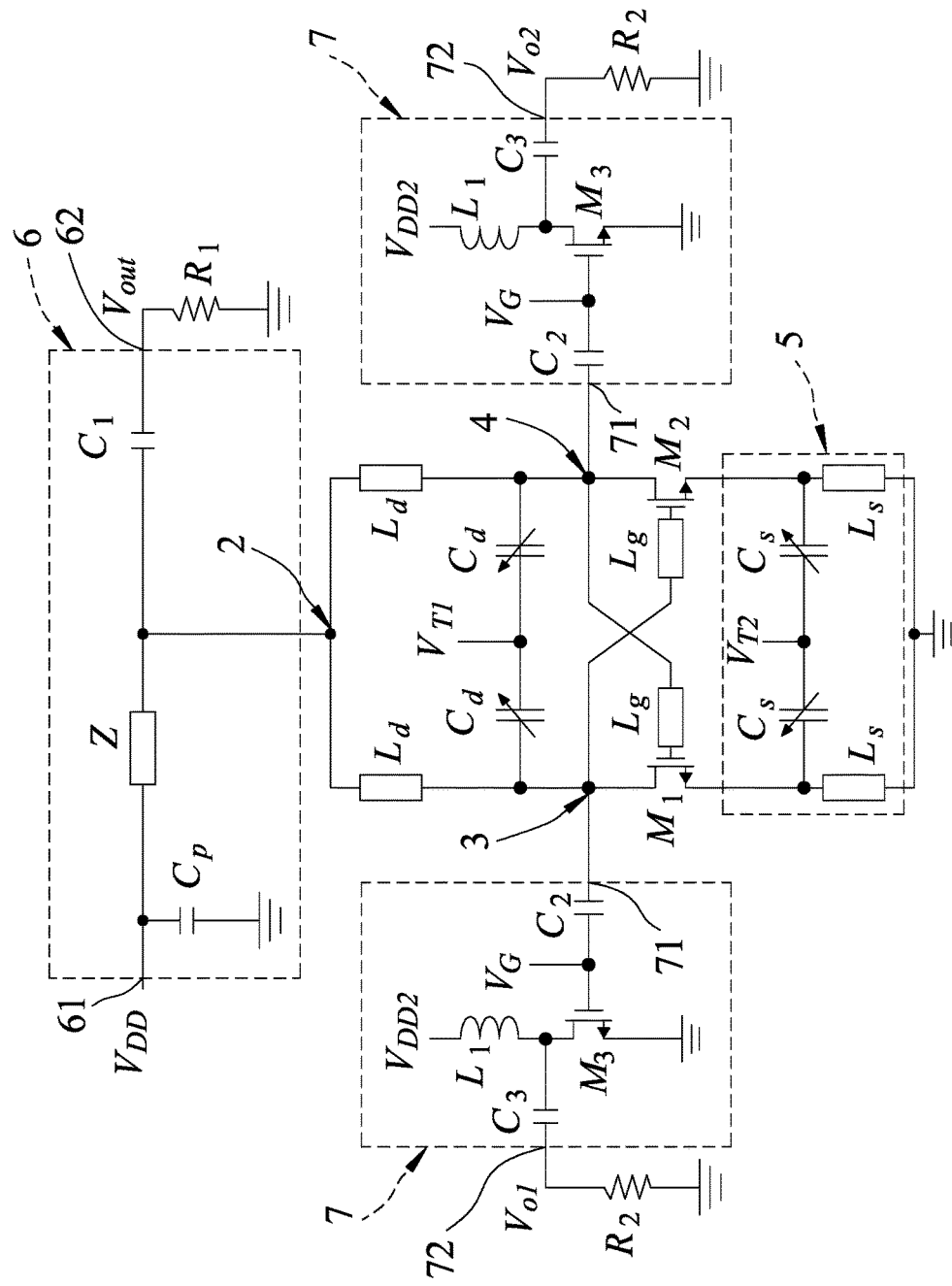
FIG. 2 is a schematic circuit diagram illustrating an embodiment of a voltage-controlled oscillator according to this disclosure.

Referring to FIG. 2, an embodiment of a voltage-controlled oscillator (VCO) according to this disclosure is shown to include two first inductors ($L_d$), two varactors ($C_d$), a first transistor ($M_1$), a second transistor ($M_2$), two second inductors ($L_g$), a reversely tunable LC source degeneration module 5, a push-push circuit 6, and two buffer amplifier circuits 7.

The first inductors ($L_d$) have a common node 2 to which a first terminal of each first inductor ($L_d$) is coupled.

Each of the varactors ($C_d$) has a first terminal receiving a first bias voltage ($V_{T1}$), a second terminal coupled to a second terminal of a respective one of the first inductors ($L_d$), and a capacitance associated with a magnitude of the first bias voltage ($V_{T1}$). The capacitances of the varactors ($C_d$) may be changed by adjusting a magnitude of the first bias voltage ($V_{T1}$).

The first transistor ($M_1$) has a first terminal coupled to the second terminal of one of the varactors ($C_d$) and serving as a first output terminal 3, a second terminal, and a control terminal.

The second transistor ($M_2$) has a first terminal coupled to the second terminal of the other one of the varactors ($C_d$) and serving as a second output terminal 4, a second terminal, and a control terminal.

In this embodiment, the first, second and control terminals of each of the first and second transistors ($M_1$, $M_2$) are respectively drain, source and gate terminals thereof.

One of the second inductors ($L_g$) is coupled between the control terminal of the first transistor ($M_1$) and the first terminal of the second transistor ($M_2$), which is the second output terminal 4. The other one of the second inductors ($L_g$) is coupled between the control terminal of the second transistor ($M_2$) and the first terminal of the first transistor ($M_1$), which is the first output terminal 3. Accordingly, the first transistor ($M_1$), the second transistor ($M_2$) and the second inductors ($L_g$) form a cross-connected pair.

The reversely tunable LC source degeneration module 5 is coupled between the second terminals of the first and second transistors ($M_1$, $M_2$) and ground, and includes two source inductors ($L_s$) and two source varactors ($C_s$) for source degeneration of the first and second transistors ($M_1$, $M_2$).

One of the source inductors ($L_s$) is coupled between the second terminal of the first transistor ($M_1$) and a reference node (e.g., ground). The other one of the source inductors ($L_s$) is coupled between the second terminal of the second transistor ($M_2$) and the reference node.

In such architecture, this embodiment of VCO may generate at the common node of the first inductors ($L_d$) an oscillating signal that has a carrier frequency of $f_0$, and harmonics with frequencies of $2f_0$, $3f_0$, $4f_0$, etc. Accordingly, the common node of the first inductors ($L_d$) serves as an oscillating signal source node. In addition, this embodiment of VCO may also generate a first oscillatory signal and a second oscillatory signal respectively at the first and second output terminals 3, 4, and the first and second oscillatory signals form a differential signal pair in this embodiment.

The source varactors ($C_s$) have a common node to which a first terminal of each source varactor ($C_s$) is coupled and which receives a second bias voltage ($V_{T2}$). Each source varactor ($C_s$) further has a second terminal coupled to the second terminal of a respective one of the first and second transistors ($M_1$, $M_2$), and a capacitance associated with a magnitude of the second bias voltage ($V_{T2}$). The capacitances of the source varactors ($C_s$) may be changed by adjusting a magnitude of the second bias voltage ($V_{T2}$).

The push-push circuit 6 is coupled to the oscillating signal source node 2 for receiving the oscillating signal therefrom, and to a first direct-current (DC) voltage source ($V_{DD}$) to receive a first voltage for provision to the oscillating signal source node 2, and outputs an oscillatory output signal ($V_{out}$) having a frequency twice the carrier frequency of the oscillating signal.

In this embodiment, the push-push circuit 6 includes a power terminal 61 coupled to the first DC voltage source ($V_{DD}$), an output terminal 62, a transmission line (Z), a DC blocking capacitor ($C_1$), and a by-pass capacitor ($C_p$). It is noted that a resistor ($R_1$) shown in FIG. 2 represents an output impedance of a load (e.g., a measuring instrument, not shown), which is generally 50 ohms.

The transmission line (Z) is coupled between the power terminal 61 and the oscillating signal source node 2, and has an impedance associated with one-quarter wavelength of a second harmonic of the oscillating signal (usually denoted as $\lambda/4$ (@$2f_0$)). Accordingly, the second harmonic of the oscillating signal that has a frequency of $2f_0$ is not transmitted toward the left direction (i.e., toward the power terminal 61), and is only transmitted toward the right direction (i.e., toward the output terminal 62) to serve as the oscillatory output signal ($V_{out}$). On the other hand, other harmonics of the oscillating signal, which have the frequencies of $f_0$, $3f_0$, $4f_0$, etc., may be transmitted toward the left direction.

The by-pass capacitor ($C_p$) is coupled between the power terminal 61 and the reference node for stabilizing input of the first voltage.

The DC blocking capacitor ($C_1$) is coupled between the oscillating signal source node 2 and the output terminal 62 for blocking the DC component and allowing passage of the alternating current (AC) component only.

Each of the buffer amplifier circuits 7 has an amplifier input terminal 71 coupled to a respective one of the first and second output terminals 3, 4 for receiving therefrom and amplifying a respective one of the first and second oscillatory signals, and an amplifier output terminal 72 at which a respective one of a first amplified oscillatory signal, which serves as a first output signal ($V_{o1}$), and a second amplified oscillatory signal, which serves as a second output signal ($V_{o2}$), is outputted.

In this embodiment, each of the buffer amplifier circuits 7 includes an amplifier transistor ($M_3$), a first DC blocking capacitor ($C_2$), a high-frequency blocking inductor ($L_1$) and a second DC blocking capacitor ($C_3$). It is noted that each of resistors ($R_2$) shown in FIG. 2 represents an output impedance of a load (e.g., a measuring instrument, not shown), which is generally 50 ohms.

The amplifier transistor ($M_3$) has a first terminal coupled to a second DC voltage source ($V_{DD2}$) and to the amplifier output terminal 72, a second terminal, and a control terminal coupled to the amplifier input terminal 71, and receiving a third voltage ($V_G$) that causes the amplifier transistor ($M_3$) to operate in a saturation region.

In this embodiment, the first, second and control terminals of each amplifier transistor ($M_3$) are respectively drain, source and gate terminals thereof.

The first DC blocking capacitor ($C_2$) is coupled between the control terminal of the amplifier transistor ($M_3$) and the amplifier input terminal 71 for blocking the DC component and allowing passage of the AC component only.

The high-frequency blocking inductor ($L_1$) has a first terminal coupled to the second voltage source ($V_{DD2}$), and a second terminal coupled to the first terminal of the amplifier transistor ($M_3$), thereby blocking the AC component and allowing passage of the DC component only.

The second DC blocking capacitor ($C_3$) is coupled between the amplifier output terminal 72 and the first terminal of the amplifier transistor ($M_3$) for blocking the DC component and allowing passage of the AC component only.

Since the operation principle for oscillation of the VCO should be familiar by persons with ordinary skills in the art, detail thereof is not described herein for the sake of brevity.

Figure 3:
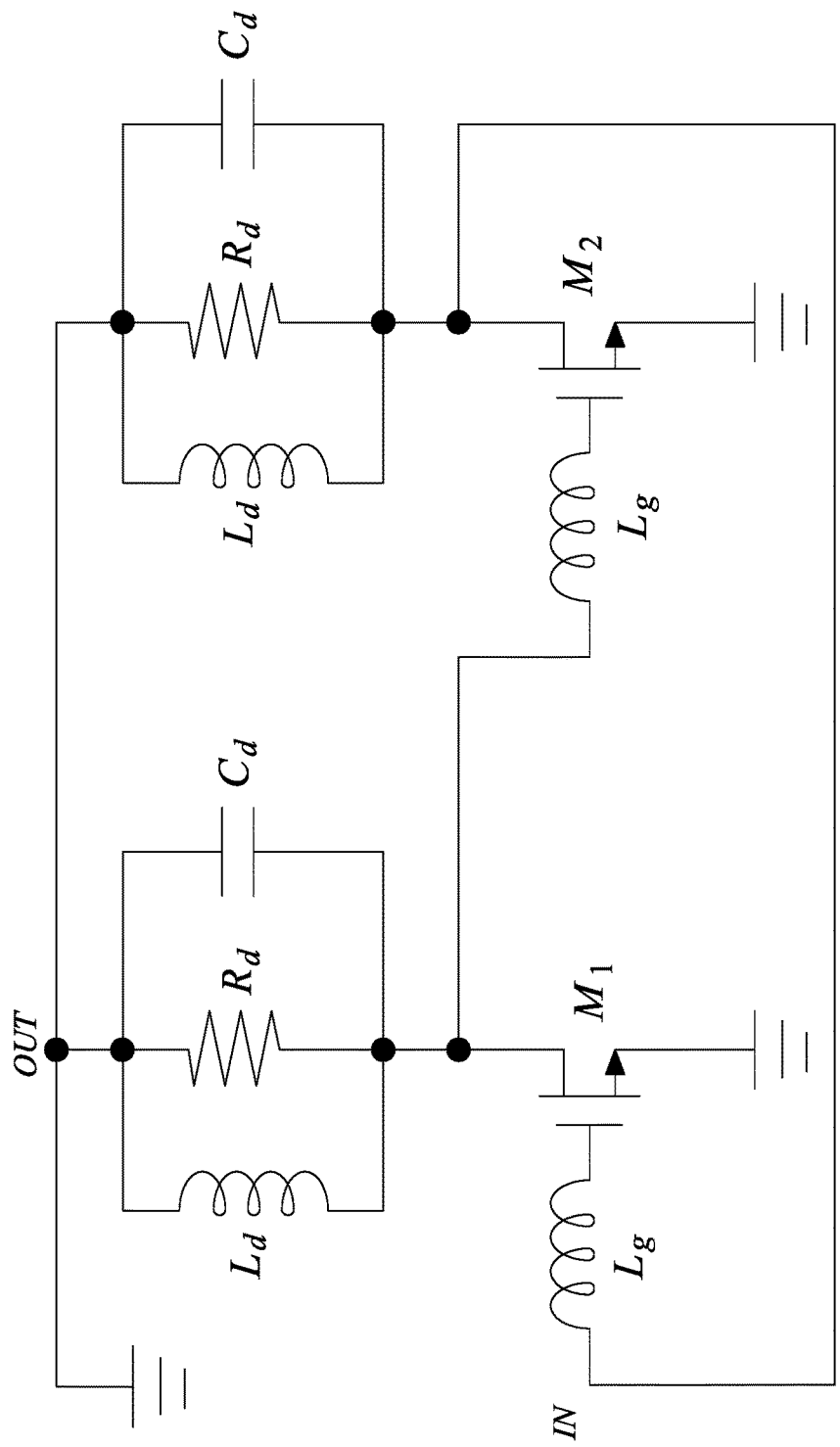
FIG. 3 is a schematic circuit diagram illustrating a small signal equivalent circuit model of the embodiment.
Figure 4:
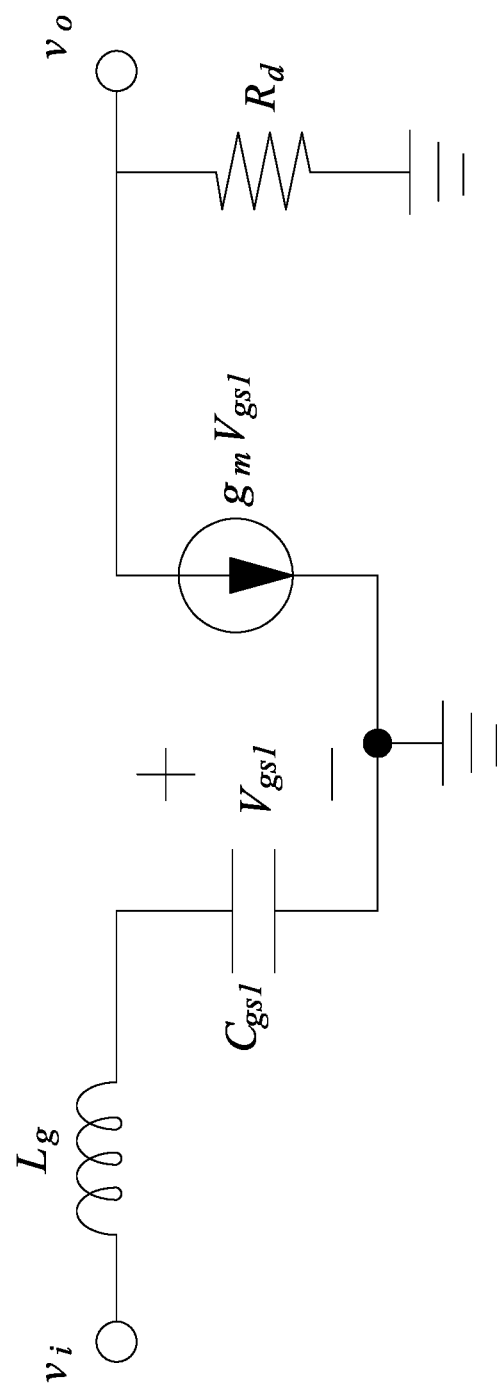
FIG. 4 is a schematic circuit diagram illustrating a single-side circuit of the small signal equivalent circuit model.

Referring to FIGS. 2 to 4, in order to facilitate description and reduce complexity of calculation, a portion of the circuit is omitted in FIGS. 3 and 4. FIG. 3 shows a small signal equivalent circuit model of the first inductor ($L_d$), the varactor ($C_d$), the second inductor ($L_g$), the first transistor ($M_1$) and the second transistor ($M_2$). FIG. 4 shows a small signal equivalent circuit model of a single-side circuit (the side of the first transistor ($M_1$)) shown in FIG. 3 at resonance, where $R_d$ represents a parasitic resistance of the first inductor ($L_d$) and the varactor ($C_d$). In the small signal equivalent circuit model, the first terminals of the first inductors ($L_d$) and the varactors ($C_d$) may be deemed to be virtually grounded. The corresponding first inductor ($L_d$) and varactor ($C_d$) may be characterized as an open circuit at resonance ($j\omega L_d = 1/j\omega C_d$, where $\omega$ is a resonant frequency of the corresponding first inductor ($L_d$) and varactor ($C_d$)), and are thus omitted in FIG. 4.

In FIG. 4, the voltage gain ($G_1$) of the single-side circuit may be derived as follows:

$$V_{gs1} = \frac{1/j\omega C_{gs1}}{1/j\omega C_{gs1} + j\omega L_g} v_i = \frac{1}{1-\omega^2 L_g C_{gs1}} v_i \quad (1)$$

$$v_o = -g_m V_{gs1} R_d = \frac{-g_m R_d}{1-\omega^2 L_g C_{gs1}} v_i \quad (2)$$

$$G_1 = \frac{v_o}{v_i} = \frac{-g_m R_d}{1-\omega^2 L_g C_{gs1}} = G_2 \quad (3)$$

In the above, $V_{gs1}$ represents a gate-source voltage of the first transistor ($M_1$), $C_{gs1}$ represents a gate-source capacitance of the first transistor ($M_1$), $v_i$, $v_o$ are respectively assumed equivalent input and output voltages, $g_m$ represents a transconductance of the first transistor ($M_1$), $G_2$ represents a voltage gain of the single-side circuit of the second transistor ($M_2$). As shown below, the total gain (G) of the entire circuit is a product of the gains ($G_1$, $G_2$) of both sides of the circuit:

$$G = G_1 \cdot G_2 = \frac{g_m^2 R_d^2}{(1-\omega^2 L_g C_{gs1})^2} \quad (4)$$

According to equation (4), in absence of the second inductors ($L_g$), the total gain (G) will be $g_m^2 R_d^2$. The addition of the second inductors ($L_g$) can increase the total gain (G) of the circuit loop, which increases the likelihood that the oscillator satisfies the condition for oscillation: total gain (G)≥1. When the total gain (G) of the circuit has been determined, the addition of the second inductors ($L_g$) may reduce the requirement for the transconductance ($g_m$) of each of the first and second transistors ($M_1$, $M_2$) resulting in lower power consumption.

Figure 5:
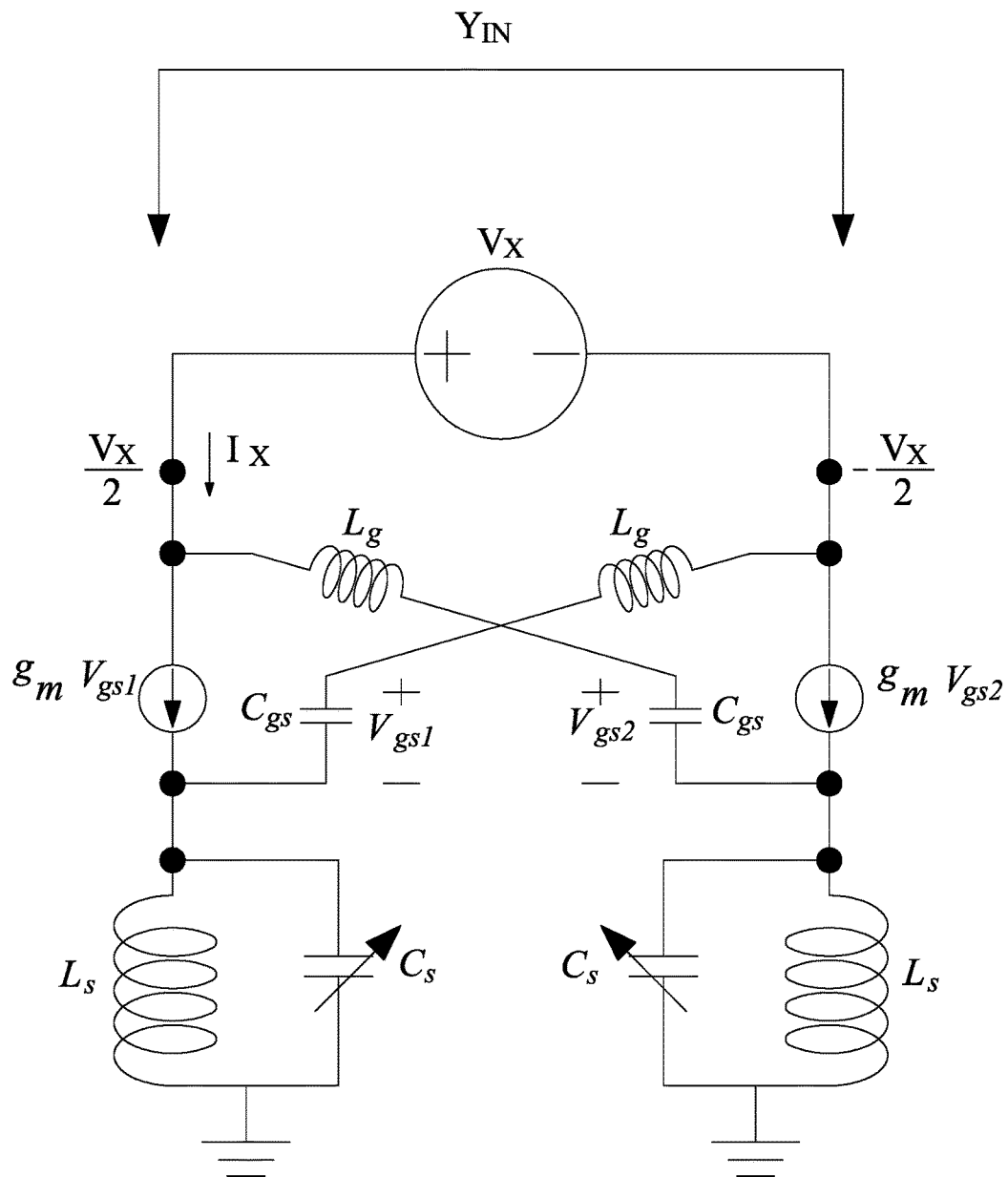
FIG. 5 is a schematic circuit diagram illustrating an equivalent circuit model of the embodiment seen into drain terminals of a first transistor and a second transistor of the embodiment.
Figure 6:
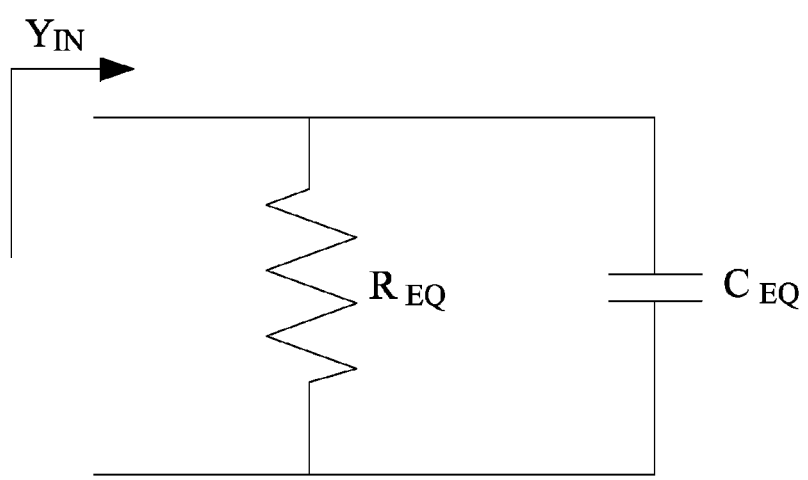
FIG. 6 is a schematic diagram illustrating effective parasitic capacitance and resistance of the equivalent circuit model.

Referring to FIGS. 2, 5 and 6, FIG. 5 shows an equivalent circuit model seen into the drain terminals of the first and second transistors ($M_1$, $M_2$).

An equivalent capacitance ($C_{EQ}$) and an equivalent resistance ($R_{EQ}$) seen into the cross-connected pair from the first terminal of each of the first and second transistors ($M_1$, $M_2$) (that is, the common node of the gate terminal of the first transistor ($M_1$) and the drain terminal of the second transistor ($M_2$) or the common node of the gate terminal of the second transistor ($M_2$) and the drain terminal of the first transistor ($M_1$)) may be derived as follows:

$$R_{EQ} = \frac{2}{-g_m} \cdot \frac{1+\left(\frac{\omega}{\omega_T}\right)^2\left(1+\frac{C_s}{C'_{gs}}\right)^2 - 2\left(\frac{\omega_1}{\omega_2}\right)^2\left(1+\frac{C_s}{C'_{gs}}\right) + \frac{\omega_1^4}{\omega^2 \omega_T^2}}{\left(\frac{\omega}{\omega_T}\right)^2 \frac{C_s}{C'_{gs}}\left(2+\frac{C_s}{C'_{gs}}\right) - 2\left(\frac{\omega_1}{\omega_T}\right)^2\left(1+\frac{C_s}{C'_{gs}}\right) + \frac{\omega_1^4}{\omega^2 \omega_T^2}} \quad (5)$$

$$C_{EQ} = \frac{C_s}{2} \cdot \frac{\frac{\omega_2^2}{\omega^2} + \frac{\omega_1^2}{\omega_T^2}\frac{\omega_2^2}{\omega^2} + \frac{\omega^2}{\omega_T^2}\left(1+\frac{C_s}{C'_{gs}}\right) - \frac{\omega_1^2}{\omega^2} - \frac{\omega_2^2}{\omega_T^2}\left(1+\frac{C_s}{C'_{gs}}\right) - 1}{\frac{\omega_1^4}{\omega^2 \omega_T^2} + \frac{\omega^2}{\omega_T^2}\left(1+\frac{C_s}{C'_{gs}}\right)^2 - 2\frac{\omega_1^2}{\omega_T^2}\left(1+\frac{C_s}{C'_{gs}}\right) + 1} \quad (6)$$

where $\omega=1/\sqrt{L_d C_d}$, $\omega_1=1/\sqrt{L_s C'_{gs}}$, $\omega_2=1/\sqrt{L_s C_s}$, $\omega_T=g_m/C'_{gs}$, $$C'_{gs} = \frac{C_{gs}}{(1-\omega_0^2 L_g C_{gs})},$$

$C_{gs}$ is a gate-source capacitance of each of the first and second transistors ($M_1$, $M_2$), $\omega_0$ is a frequency of each of the first and second oscillatory signals, $\omega$ is a resonant frequency of the first inductor ($L_d$) and the varactor ($C_d$), $\omega_1$ is a resonant frequency of the source inductor ($L_s$) and the gate-source capacitance ($C_{gs}$) of the corresponding transistor ($M_1$, $M_2$), $\omega_2$ is a resonant frequency of the source inductor ($L_s$) and the corresponding source capacitor ($C_s$), $\omega_T$ is a current-gain cut-off frequency of each of the first transistor ($M_1$) and the second transistor ($M_2$). When $\omega_T \gg \omega_1$ and $\omega_T \gg \omega_2$, equations (5), (6) may be simplified as:

$$R_{EQ} = \frac{2}{-g_m} \cdot \frac{1+\left(\frac{\omega}{\omega_T}\right)^2\left(1+\frac{C_s}{C'_{gs}}\right)^2}{\left(\frac{\omega}{\omega_T}\right)^2 \frac{C_s}{C'_{gs}}\left(2+\frac{C_s}{C'_{gs}}\right)} \quad (7)$$

$$C_{EQ} = \frac{C_s}{2} \cdot \frac{\frac{\omega^2}{\omega_T^2}\left(1+\frac{C_s}{C'_{gs}}\right) - 1}{\frac{\omega^2}{\omega_T^2}\left(1+\frac{C_s}{C'_{gs}}\right)^2 + 1} \quad (8)$$

It is known from equation (8) that $C_s/C_{gs}$ is reduced when $C_s$ becomes small, thereby reducing the equivalent capacitance ($C_{EQ}$).

In the VCO, since the corresponding first inductor ($L_d$), varactor ($C_d$) and equivalent capacitance ($C_{EQ}$) form an LC resonant structure, reducing the equivalent capacitance ($C_{EQ}$) may result in a smaller total capacitance (C) (i.e., an equivalent capacitance of the varactor ($C_d$) and the equivalent capacitance ($C_{EQ}$) that are coupled in parallel), which may lead to higher operation frequency ($f_0$) of the VCO because the operating frequency ($f_0$) of the VCO is determined according to the total inductance (L) and the total capacitance (C) of the LC resonant structure:

$$f_o = \frac{1}{2\pi\sqrt{L_d(C_d + 2C_{EQ} + C_{other})}} \quad (9)$$

where $C_{other}$ represents an equivalent capacitance of source-drain capacitance of the first transistor ($M_1$) and the second transistor ($M_2$) and a capacitance seen into the third transistor ($M_3$) from the corresponding one of the first output terminal 3 and the second output terminal 4. According to equations (6) and (9), in some embodiments, the inductors ($L_g$, $L_s$), the capacitor ($C_s$) and dimensions (e.g., channel widths) of the transistors ($M_1$, $M_2$) which are associated with the transconductance ($g_m$) and the gate-source capacitance ($C_{gs}$) may be appropriately designed such that $$\left[\frac{\omega_2^2}{\omega^2} + \frac{\omega_1^2}{\omega_T^2}\frac{\omega_2^2}{\omega^2} + \frac{\omega^2}{\omega_T^2}\left(1 + \frac{C_s}{C_{gs}}\right)\right] < \left[\frac{\omega_1^2}{\omega_T^2} + \frac{\omega_2^2}{\omega_T^2}\left(1 + \frac{C_s}{C_{gs}}\right) + 1\right].$$

In this case, the numerator of equation (8) would be negative, thereby resulting in a negative equivalent capacitance ($C_{EQ}$), and thus a higher operating frequency ($f_0$).

In addition, when the equivalent capacitance ($C_{EQ}$) becomes smaller, the varactor ($C_d$) occupies a relatively larger proportion of the total capacitance (C) of the LC resonant structure. Therefore, adjustment of the capacitance of the varactor ($C_d$) can have a larger effect on the total capacitance (C), thereby resulting in a larger adjustable range of the operating frequency.

A phase noise of this embodiment may be derived using the Lesson's formula as follows:

$$L(\Delta f) = 10\log\left\{\left[1 + \left(\frac{f_o}{2\Delta f Q}\right)^2\right]\left(1 + \frac{f_c}{\Delta f}\right)\frac{FkT}{2P_{av}} + \frac{2kTRK_{VCO}^2}{(\Delta f)^2}\right\} \quad (10)$$

where L(Δf) represents the phase noise (unit: dBc/Hz) when a frequency offset from a carrier frequency ($f_0$) is Δf, $f_c$ represents a flicker noise corner frequency (unit: Hz), Q represents a loaded quality factor, F represents a noise factor, k is the Boltzmann constant (unit: J/K), T represents a temperature (unit: K), $P_{av}$ represents an average power at the output of the VCO, R represents an equivalent noise resistance of each source varactor ($C_s$), and $K_{vco}$ represents an oscillator voltage gain (unit: Hz/V).

It is known from equation (9) that the phase noise (L(Δf)) may be reduced by reducing the oscillator voltage gain ($K_{vco}$). When the inductors ($L_s$) have been determined, the oscillator voltage gain ($K_{vco}$) is a ratio dC/dV of the source varactor ($C_s$), which means that it is better to bias the source varactors ($C_s$) in a low $K_{vco}$ mode rather than a high $K_{vco}$ mode, thereby obtaining better phase noise (L(Δf)). Biasing in the $K_{vco}$ mode refers to biasing at a voltage-frequency conversion mode, wherein the low $K_{vco}$ mode refers to a configuration corresponding to a C-V curve with a low steepness slope the high $K_{vco}$ mode refers to a configuration corresponding to a C-V curve with a high steepness slope, and the slope of the C-V curve refers to a ratio (dC/dV) of each source varactor ($C_s$).

Referring back to FIG. 2, in this embodiment, the first transistor ($M_1$) and the second transistor ($M_2$) can form the oscillating signal with a carrier frequency $$f_o = \frac{1}{2\pi\sqrt{L_d(C_d + 2C_{EQ} + C_{other})}}$$

at the oscillating signal source node 2 (in this embodiment, the carrier frequency ($f_0$) is designed to be 30 GHz). Since the transmission line (Z) has an impedance of λ/4 (@2$f_0$), the transmission line (Z) serves as an open circuit when a signal transmitted thereon has a frequency of 2$f_0$, and has a relatively low impedance with respect to the other high-harmonic frequencies. Accordingly, only the oscillatory output signal ($V_{out}$) with the frequency of 2$f_0$ (i.e., 60 GHz for this embodiment) may be provided at the output terminal 62. By virtue of the push-push circuit 6, the signals that respectively have the two frequencies of $f_0$ and 2$f_0$ may be outputted at the same time.

FIG. 7 shows comparison between the equivalent capacitances ($C_{EQ}$) of the embodiment and a conventional VCO which does not include the inductors ($L_g$, $L_s$) and the varactors ($C_s$) of the embodiment. It can be seen from FIG. 7 that in a case that the equivalent capacitance ($C_{EQ}$) of the conventional VCO is configured to be 0.5$C_{gs}$, the equivalent capacitance ($C_{EQ}$) of this embodiment is adjustable according to the capacitor ($C_s$), and may even be adjusted to be negative. By virtue of such design, a VCO of 94 GHz may be realized using a relatively cheaper process of 90 nm CMOS technology.

In summary, the embodiment of the VCO according to this disclosure has the following advantages:

1. The reversely tunable source degeneration module 5 may contribute to reduce the equivalent capacitance ($C_{EQ}$) of the first and second transistors ($M_1$, $M_2$), thereby significantly improving upon the operating frequency and the adjustable frequency range.

2. The second inductors ($L_g$) at the gate terminals of the first and second transistors ($M_1$, $M_2$) can improve the total gain (G) of the circuit loop, and increase the likelihood that the oscillator satisfies the condition for oscillation: total gain (G)≥1. When the total gain (G) of the circuit has been determined, the addition of the second inductors ($L_g$) may reduce the requirement for the transconductance ($g_m$) of each of the first and second transistors ($M_1$, $M_2$), resulting in lower power consumption.

3. The first inductors ($L_d$) and the source inductors ($L_s$) are added so that a DC voltage drop between the oscillating signal source node 2 and ground may be omitted, thereby significantly reducing the supply voltage required by the entire circuit, and reducing power consumption in comparison to conventional techniques.

4. The reversely tunable source degeneration module 5 may contribute to reduce the phase noise (L(Δf)) via reducing the oscillator voltage gain ($K_{vco}$) by changing the second bias voltage ($V_{T2}$) to adjust $K_{vco}$ mode in which the source varactors ($C_s$) are biased.

5. The push-push circuit 6 may contribute to provide outputs with two different frequencies, thereby achieving a dual-band output.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A voltage-controlled oscillator comprising:
    two first inductors having a common node, each of said first inductors having a first terminal coupled to said common node, and a second terminal;
    two first varactors, each having a first terminal disposed to receive a first bias voltage, a second terminal coupled to said second terminal of a respective one of said first inductors, and a capacitance associated with a magnitude of the first bias voltage;
    a cross-connected pair including:
        a first transistor and a second transistor, each having a first terminal coupled to said second terminal of a respective one of said first varactors, a second terminal and a control terminal; and
        two second inductors, one of which is coupled between said control terminal of said first transistor and said first terminal of said second transistor, and the other one of which is coupled between said control terminal of said second transistor and said first terminal of said first transistor; and a reversely tunable source degeneration module coupled to said second terminals of said first and second transistors, configured for source degeneration of said first and second transistors, and cooperating with said first and second transistors and said second inductors to form a negative equivalent capacitance seen into said cross-connected pair from said first terminal of each of said first and second transistors, wherein a first oscillatory signal is provided at said first terminal of said first transistor, and a second oscillatory signal is provided at said first terminal of said second transistor, wherein said reversely tunable source degeneration module includes:

two source inductors, one of which is disposed to couple said second terminal of said first transistor to a reference node, and the other one of which is disposed to couple said second terminal of said second transistor to the reference node; and two source varactors having a common node disposed to receive a second bias voltage, each of said source varactors having a first terminal coupled to said common node of said source varactors, a second terminal coupled to said second terminal of a respective one of said first and second transistors, and a capacitance associated with a magnitude of the second bias voltage, the voltage-controlled oscillator further satisfying $$\left[\frac{\omega_2^2}{\omega^2} + \frac{\omega_1^2}{\omega_T^2}\frac{\omega_2^2}{\omega^2} + \frac{\omega^2}{\omega_T^2}\left(1 + \frac{C_s}{C_{gs}'}\right)\right] < \left[\frac{\omega_1^2}{\omega_T^2} + \frac{\omega_2^2}{\omega_T^2}\left(1 + \frac{C_s}{C_{gs}'}\right) + 1\right],$$

where $\omega=1/\sqrt{L_d C_d}$, $\omega_1=1/\sqrt{L_s C_{gs}'}$, $\omega_2=1/\sqrt{L_s C_s}$, $\omega_T=g_m/C_{gs}'$, $$C_{gs}' = \frac{C_{gs}}{(1 - \omega_0^2 L_g C_{gs})},$$

$\omega_0$ represents a frequency of each of the first and second oscillatory signals, $C_s$ represents a capacitance of each of said source varactors, $L_d$ represents an inductance of each of said first inductors, $C_d$ represents a capacitance of each of said first varactors, $L_s$ represents an inductance of each of said second inductors, $g_m$ represents a transconductance of each of said first and second transistors, and $C_{gs}$ represents a gate-source capacitance of each of said first and second transistors.

2. The voltage-controlled oscillator of claim 1, wherein said common node of said first inductors serves as an oscillating signal source node at which an oscillating signal is provided, said voltage-controlled oscillator further comprising:

a push-push circuit coupled to said oscillating signal source node for receiving the oscillating signal therefrom, and configured to output an oscillatory output signal having a frequency that is twice a frequency of the oscillating signal.

3. The voltage-controlled oscillator of claim 2, wherein said push-push circuit includes:

a power terminal to be coupled to a first voltage source; and a transmission line coupled between said power terminal and said oscillating signal source node, and having an impedance associated with one-quarter wavelength of a second harmonic of the oscillating signal.

4. The voltage-controlled oscillator of claim 3, wherein said push-push circuit further includes:

an output terminal at which the oscillatory output signal is outputted;

a by-pass capacitor disposed to couple the power terminal to the reference node; and a direct-current (DC) blocking capacitor coupled between said oscillating signal source node and said output terminal.

5. The voltage-controlled oscillator of claim 3, further comprising:

two buffer amplifier circuits, each being coupled to said first terminal of the respective one of said first and second transistors for receiving therefrom and amplifying a respective one of the first and second oscillatory signals, and being configured to output a respective one of a first amplified oscillatory signal and a second amplified oscillatory signal.

6. The voltage-controlled oscillator of claim 5, wherein each of said buffer amplifier circuits includes:

an amplifier output terminal at which the respective one of a first amplified oscillatory signal and a second amplified oscillatory signal is outputted; and an amplifier transistor having a first terminal that is to be coupled to a second voltage source and that is coupled to said amplifier output terminal, a second terminal, and a control terminal that is coupled to said first terminal of the respective one of said first and second transistors, and that is disposed to receive a third voltage that causes said amplifier transistor to operate in a saturation region.

7. The voltage-controlled oscillator of claim 6, wherein each of said buffer amplifier circuits further includes:

a first direct-current (DC) blocking capacitor coupled between said control terminal of said amplifier transistor and said first terminal of the respective one of said first and second transistors;

a high-frequency blocking inductor having a first terminal to be coupled to the second voltage source, and a second terminal coupled to said first terminal of said amplifier transistor; and a second DC blocking capacitor coupled between said amplifier output terminal and said first terminal of said amplifier transistor.

8. The voltage-controlled oscillator of claim 1, wherein said common node of said first inductors serves as an oscillating signal source node at which an oscillating signal is provided, said voltage-controlled oscillator further comprising:

a push-push circuit coupled to said oscillating signal source node for receiving the oscillating signal therefrom, and configured to output an oscillatory output signal having a frequency that is twice a frequency of the oscillating signal.

9. The voltage-controlled oscillator of claim 8, wherein said push-push circuit includes:

a power terminal to be coupled to a first voltage source; and a transmission line coupled between said power terminal and said oscillating signal source node, and having an impedance associated with one-quarter wavelength of a second harmonic of the oscillating signal.

10. The voltage-controlled oscillator of claim 9, wherein said push-push circuit further includes:
   an output terminal at which the oscillatory output signal is outputted;
   a by-pass capacitor disposed to couple the power terminal to the reference node; and
   a direct-current (DC) blocking capacitor coupled between said oscillating signal source node and said output terminal.

11. The voltage-controlled oscillator of claim 9, further comprising:
   two buffer amplifier circuits, each being coupled to said first terminal of the respective one of said first and second transistors for receiving therefrom and amplifying a respective one of the first and second oscillatory signals, and being configured to output a respective one of a first amplified oscillatory signal and a second amplified oscillatory signal.

12. The voltage-controlled oscillator of claim 11, wherein each of said buffer amplifier circuits includes:
   an amplifier output terminal at which the respective one of a first amplified oscillatory signal and a second amplified oscillatory signal is outputted; and
   an amplifier transistor having a first terminal that is to be coupled to a second voltage source and that is coupled to said amplifier output terminal, a second terminal, and a control terminal that is coupled to said first terminal of the respective one of said first and second transistors, and that is disposed to receive a third voltage that causes said amplifier transistor to operate in a saturation region.

13. The voltage-controlled oscillator of claim 12, wherein each of said buffer amplifier circuits further includes:
   a first direct-current (DC) blocking capacitor coupled between said control terminal of said amplifier transistor and said first terminal of the respective one of said first and second transistors;
   a high-frequency blocking inductor having a first terminal to be coupled to the second voltage source, and a second terminal coupled to said first terminal of said amplifier transistor; and
   a second DC blocking capacitor coupled between said amplifier output terminal and said first terminal of said amplifier transistor.

* * * * *